(12) United States Patent
Miyano

(10) Patent No.: US 7,020,228 B2
(45) Date of Patent: Mar. 28, 2006

(54) DLL CIRCUIT

(75) Inventor: Kazutaka Miyano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 876 days.

(21) Appl. No.: 09/836,480

(22) Filed: Apr. 18, 2001

(65) Prior Publication Data

US 2001/0046272 A1 Nov. 29, 2001

(30) Foreign Application Priority Data

Apr. 18, 2000 (JP) .............................. 2000-117007

(51) Int. Cl.
H03D 3/24 (2006.01)
(52) U.S. Cl. ...................... 375/376; 375/375; 375/373; 375/327; 327/102; 327/147; 327/159; 331/1 R
(58) Field of Classification Search ................ 375/376, 375/374, 375, 371, 316, 257, 355, 149, 373, 375/327; 327/158, 156, 142, 356, 159, 102, 327/147; 326/100; 323/315, 313; 365/233; 331/1 R
See application file for complete search history.

(56) References Cited

U.S. PATENT DOCUMENTS

| 4,438,353 | A | * | 3/1984 | Sano et al. | ................. | 326/100 |
| 5,886,946 | A | * | 3/1999 | Ooishi | ........................ | 365/233 |
| 6,198,332 | B1 | * | 3/2001 | O'Toole et al. | ............. | 327/356 |
| 6,239,633 | B1 | * | 5/2001 | Miyano | ....................... | 327/158 |
| 6,285,725 | B1 | * | 9/2001 | Sung et al. | ................. | 375/374 |

FOREIGN PATENT DOCUMENTS

| JP | 9-17179 | 1/1997 |
| JP | 9-512966 | 12/1997 |
| KR | 1998-056057 | 9/1998 |

OTHER PUBLICATIONS

Low-jitter process-independent DLL and PLL based on self-biased techniques, Maneatis, J.G.; Solid-State Circuits, IEEE Journal of, vol.: 31, Issue: 11, Nov. 1996, pp.: 1723-1732.*
Korean Office Action dated Dec. 18, 2002.
Japanese translation of Korean Office action dated Dec. 16, 2002.
English transaltion of Japanese translation.

* cited by examiner

Primary Examiner—Stephen Chin
Assistant Examiner—Ted M. Wang
(74) Attorney, Agent, or Firm—Whitham, Curtis & Christofferson, PC

(57) ABSTRACT

A DLL (delay locked loop) circuit for outputting a phase lock signal having a predetermined phase relationship with an input signal. The DLL circuit has: a functional block having a constant-current source; and bias generator for generating a constant current source bias signal for controlling the constant current source of the functional block, the bias generator comprising a bias control which changes the bias signal according to the frequency of the input signal.

5 Claims, 14 Drawing Sheets

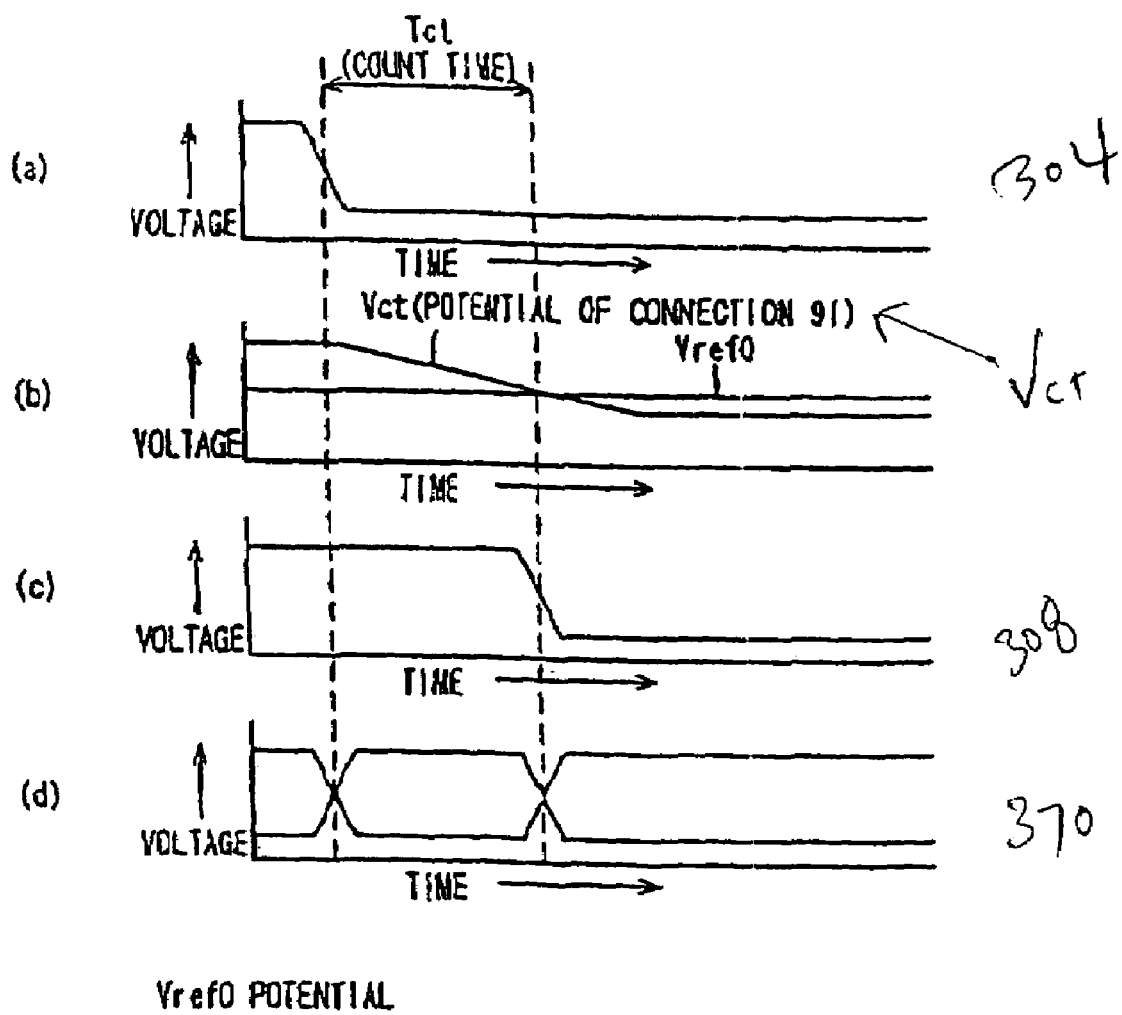

DLL CIRCUIT

FIELD OF THE INVENTION

The invention relates to a DLL (delay locked loop) circuit which outputs a phase lock signal having a predetermined phase relationship with an input signal, and more particularly to a DLL circuit which, when the frequency of the input signal has been brought to a low frequency, can efficiently reduce power consumption while stably maintaining the operation.

BACKGROUND OF THE INVENTION

FIG. 1 is a block diagram showing the construction of a DLL circuit disclosed in Japanese Patent Laid-Open No. 17179/1997 (hereinafter referred to as "first conventional technique").

The DLL circuit according to the first conventional technique comprises; a four-phase basic clock generation circuit 541 which generates four phase clocks different from one another in phase by 90 degrees relative to an input clock 601 having a frequency f; a phase detection circuit 542 for detecting a phase relationship between the input clock 601 and an output clock 603; a phase regulation decision circuit 544 which, upon the input of control signals 608 and 609 output from the phase detection circuit 542, outputs signals 614 and 615 with phase regulation level reduced or increased by given level according to the input levels of the control signals; a phase shifting circuit 543 which, upon the input of signals 610 to 613 output from the four-phase basic clock generation circuit 541, mixes these signals together and executes phase shifting according to the signals 614 and 615 output from the phase regulation decision circuit 544; and an output circuit 545 which permits the input of signals 616 and 617 output from the phase shifting circuit 543 and outputs them as an output clock 603 having a frequency f. The phase detection circuit 542 comprises a phase decision circuit 511 and a level shifting circuit 513 for regulating the level of the signal output from the phase decision circuit 511.

FIG. 2 is a block diagram showing the construction of a DLL circuit disclosed in Publication No. 512966/1997 of the Translation of International Patent Application (hereinafter referred to as "second conventional technique").

The DLL circuit according to the second conventional technique comprises: a duty cycle correction amplifier 700 which corrects the duty cycle of an input reference clock signal and outputs a duty cycle corrected signal; a phase detector 710 which compares the phase of a clock signal output from the DLL circuit with the phase of a reference clock signal and generates and outputs a signal which indicates whether the phase of the output clock signal is in advance of or delays from the phase of the reference clock signal; a charge pump 720 (preferably a differential charge pump) which is driven by a signal output from the phase detector 710 and generates an output current according to the output signal: a phase shifter 730 into which the duty cycle corrected signal, a signal output from the phase detector 710, and a current output from the charge pump 720 are input and which performs phase shifting of the duty cycle corrected signal to a direction indicated by the signal output from the phase detector 710 and outputs a phase s corrected signal; a second duty, cycle corrector 740 into which the phase corrected signal output from the phase shifter 730 and an output clock signal are input to correct the duty cycle of the output clock signal to a desired value; and a buffer amplifier 750 for amplifying the output clock signal to a predetermined amplitude.

DLL circuits are divided into two types, that is, a type wherein the delay of an input signal is regulated to digitally control the phase, and a type wherein m signals, wherein m is an integer of two or more, different from each other in phase are generated from an input signal and are then combined to control the phase in an analog manner.

A typical example of devices, in which DLL circuits are used, is synchronous DRAM (dynamic random-access memory). The control of the operation of double data rate-type (DDR-type) devices, which are operated in synchronization with a complementary clock signal, in particular, among the synchronous DRAMS is carried out using a signal having a duty falling within a given range and further requires a timing signal other than one cycle or half cycle unit of a reference clock signal.

In DLL circuits wherein the phase is digitally controlled, a reference clock signal is delayed to generate desired timing. This makes it difficult to generate timing other than one cycle or half cycle unit of the reference clock signal.

For this reason, in devices which additionally require a timing signal other than one cycle or half cycle unit of the reference clock signal, such as DDR-type synchronous DRAMs, it is a common practice to use DLL circuits, which control the phase in an analog manner, as shown in the above-described first and second conventional techniques.

The DLL circuits, which control the phase in an analog manner, however, involve a problem that lowering the operating frequency does not reduce current consumption.

Specifically, in DLL circuits which digitally control the phase, CMOS transistors are used to constitute the circuits. Therefore, lowering the operating frequency results in lowered current consumption.

On the other hand, in DLL circuits which control the phase in an analog manner, as can be seen from the second conventional technique, a differential amplifier circuit provided with a constant-current source is used to generate a desired timing signal. For example, a more specific circuit diagram of a phase detector as a major element in the DLL circuit according to the second conventional technique is shown in FIG. 3, and a more specific circuit diagram of a duty cycle correction amplifier as a major element in the DLL circuit according to the second conventional technique is shown in FIG. 4. Further, a block diagram of a phase shifter as other element in the DLL circuit according to the second conventional technique is shown in FIG. 5, and a block diagram of a phase corrector contained in the phase shifter shown in FIG. 5 is shown in FIG. 6. As can be seen from FIGS. 3 to 6, in all the cases, a differential amplifier circuit provided with a constant-current source is used.

In general, the current value of the constant-current source in the differential amplifier circuit is fixed to a value large enough to correspond to the highest operating speed from the viewpoint of realizing high-speed operation. Therefore, lowering the operating frequency does not contribute to a reduction in current consumption.

When DLL circuits, in which the above differential amplifier circuit has been extensively used, are used at a significantly lower speed than the highest operating speed, they can be operated even when the current value of the constant-current source in each differential amplifier circuit is considerably low. The conventional DLL circuits, however, do not have any means which can automatically vary the current value of the constant-current source in each incorporated differential amplifier circuit according to the operating speed (frequency of signal input into DLL circuit).

Therefore, an attempt to use the conventional DLL circuit, which can cope with a high input signal frequency, also in the case of a low input signal frequency poses a problem or wasteful power consumption.

SUMMARY OF THE INVENTION

Accordingly, it is an object of the invention to provide a DLL circuit which can automatically vary the current value of the constant-current source in each incorporated differential amplifier circuit according to the frequency of input signals and can reduce power consumption according to the frequency of input signals over a wide range of frequencies of input signals.

According to the first feature of the invention, a DLL circuit for outputting a phase lock signal having a predetermined phase relationship with an input signal, comprises at least;

a functional block having a constant current source; and bias generation means for generating an internal bias signal for a constant current source, for controlling the constant current source of the functional block, said bias generation means comprising bias control means which changes the internal bias signal according to the frequency of the input signal.

In this case, the bias generation means may comprise: a first bias generation circuit for generating a primary bias signal corresponding to a predetermined constant current; and a second bias generation circuit for generating an internal bias signal based on a bias correction signal output from the bias control means according to the frequency of the primary bias signal and the input signal.

The bias control means may comprise: measuring means for measuring the frequency of the input signal; and correction signal generation means for outputting a bias correction signal based on the results of the measurement with the measuring means.

Alternatively, the bias control means may comprise: a control circuit for outputting a first counting control signal which controls the start of counting of the input signal based on a predetermined external signal; a counting control means for outputting a second counting control signal after the elapse of a predetermined time from the input of the first counting control signal; counting means for controlling the start and end of counting of the input signal respectively according to the first counting control signal and the second counting control signal; and correction signal generation means for outputting a bias correction signal based on the results of counting by the counting means.

In this case, the output signal of the counting control means may be controlled by the primary bias signal.

Preferably, the counting control means comprises PMOS (p-channel MOS), first NMOS (n-channel MOS), second NMOS (n-channel MOS), a capacitative element, and a comparison circuit, wherein: a source electrode terminal of PMOS is connected to a power terminal, a drain electrode terminal of PMOS is connected by common connection to a drain electrode terminal of the first NMOS, a first electrode terminal of the capacitative element, and a first input terminal of the comparison circuit; a source electrode terminal of the first NMOS is connected by common connection to a drain electrode terminal of the second NMOS; a source electrode terminal of the second NMOS, together with a second electrode terminal of the capacitative element, is connected to a ground terminal; a gate electrode terminal of each of PMOS and the first NMOS is connected by common connection to an output terminal of the control circuit for outputting the first counting control signal: a gate terminal of the second NMOS is connected to a primary bias output terminal of the first bias generation circuit; and a second input terminal of the comparison circuit is connected to a reference signal terminal having a predetermined potential, and a second counting control signal is output from an output terminal of the comparison circuit.

The above-described DLL circuits for outputting a phase-lock signal having a predetermined phase relationship with an input signal preferably comprise:

phase shifting means for generating m phase shift processing signals, wherein m is an integer of two or more, different from each other in phase based on the input signal;

phase comparison means which compares the phase of the input signal with the phase of the phase lock signal to detect a phase difference and, based on the detected phase difference, outputs a phase control signal;

phase synthesizing means for outputting a phase corrected signal having a predetermined phase relationship with the input signal based on the m phase shift processing signals, produced by the phase shifting means, and the phase control signal; and first duty correction means which corrects the duty of the phase corrected signal and outputs the phase lock signal.

In this case, a construction may be adopted wherein second duty correction means for correcting the duty of the input signal and outputting a duty corrected signal is further provided and the duty corrected signal is input into the phase shifting means.

BRIEF DESCRIPTION OF THE DRAWINGS

The invention will be explained in more detail in conjunction with the appended drawings.

FIG. 11 is a diagram illustrating a counting circuit and correction signal generation means, wherein

FIG. 14 is a typical timing chart for major signals associated with counting control means.

DESCRIPTION OF THE PREFERRED EMBODIMENTS

Preferred embodiments of the invention will be explained in conjunction with the accompanying drawings.

Figure 7:
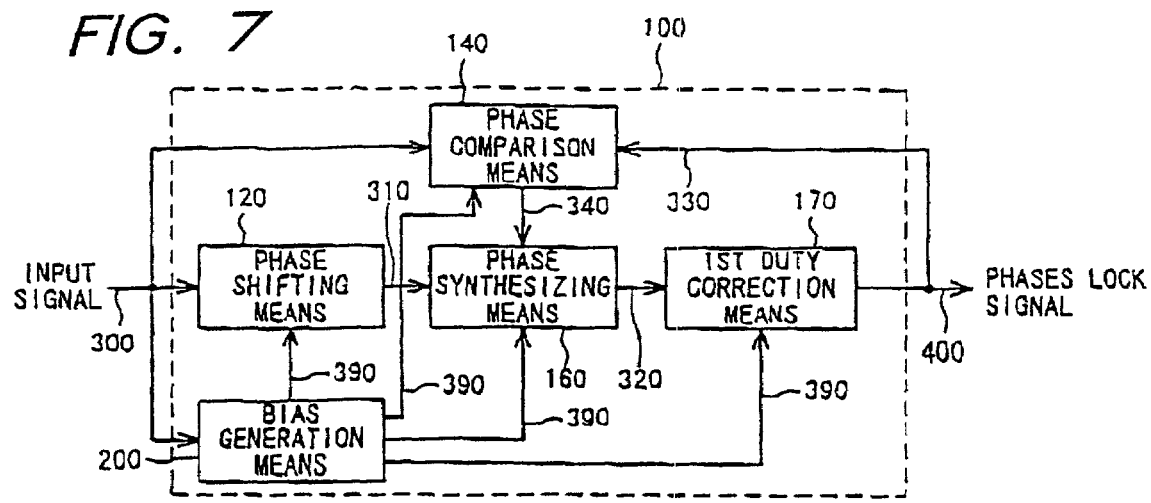
FIG. 7 is a diagram illustrating a DLL circuit according to a first preferred embodiment of the invention including a schematic block diagram showing the construction of the DLL circuit.

FIG. 7 is a diagram illustrating a DLL circuit according to a first preferred embodiment of the invention.

With reference to FIG. 7, the DLL circuit 100 according to this preferred embodiment comprises: phase shifting means 120 which, based on an input signal 300, generates, for example, 8 phase shifting processing signals 310 having phase differences at equal spacings (45 degrees); phase comparison means 140 which compares the phase of the input signal 300 with the phase of an output feedback signal 330 to detect a phase difference and, based on the detected phase difference, outputs a phase control signal 340; phase synthesizing means 160 which outputs a phase corrected signal 320 having a predetermined phase relationship with the input signals 300 based on the 8 phase shifting processing signals 310, generated by the phase shifting means 120, and the phase control signal 340; and first duty correction means 170 which corrects the duty of the phase corrected signal 320 to a predetermined duty (for example, 49 to 51%) and outputs a phase lock signal 400.

Each of these means comprises a functional block having a differential amplifier circuit provided with a constant-current source. The DLL circuit 100 further comprises bias generation means 200 which generates a bias signal 390 for controlling the current value of these constant-current sources and supplies the bias signal 390 to each constant-current source.

Figure 8:
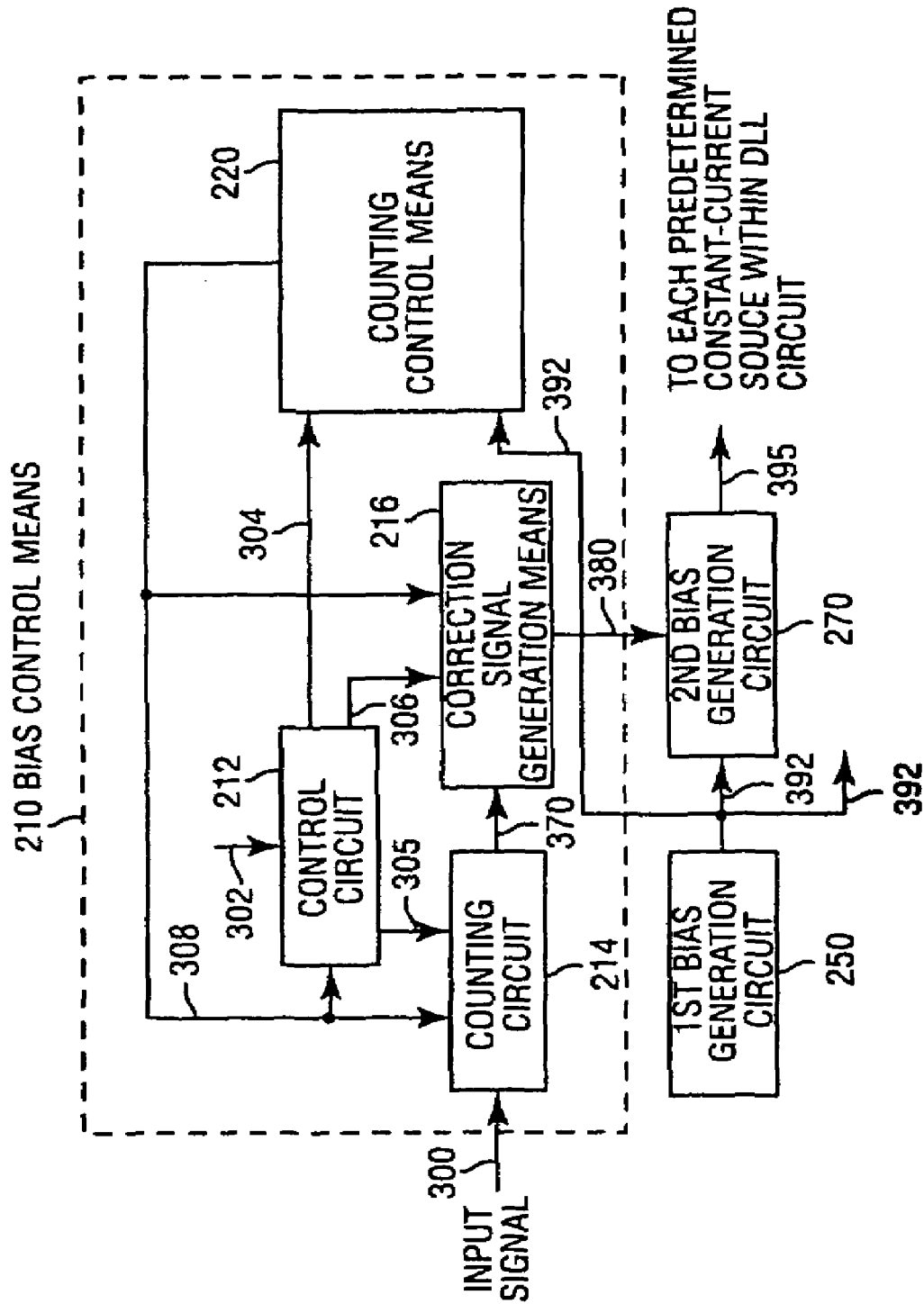
FIG. 8 is a schematic block diagram showing the construction of bias generation means included in this DLL circuit.

With reference to FIG. 8, bias generation means 200 comprises: a first bias generation circuit 250 which generates a primary bias signal 392 such that, when the frequency of the signal 300 input into the DLL circuit 100 is the highest, the current value of a constant-current source in each differential amplifier circuit is brought to a predetermined current value Is1 at which each differential amplifier circuit is normally operated; bias control means 210 which outputs a bias correction signal 380 for correcting the primary bias signal 392 according to the frequency of the input signal 300; and a second bias generation circuit 270 which, based on the primary bias signal 392 and the -.bias correction signal 380, generates an internal bias signal 395 such that the current value of the constant-current source is brought to a value which enables each differential amplifier circuit to be operated at the frequency of the input signal 300.

The bias control means 210 comprises: a control circuit 212 which outputs first counting control signals 304, 305, 306, based on a trigger signal 302 such as an external power on signal or reset signal; counting control means 220 into which the first counting control signal 304 is input and which outputs a second counting control signal 308 after the elapse of a predetermined time determined depending upon the primary bias signal 392; a counting circuit 214 which starts the counting of the input signal 300 in response to the first counting control signal 305, stops the counting of the input signal 300 in response to the second counting control signal 308, and outputs a counting result signal 370; and correction signal generation means 216 for outputting a bias correction signal 380 based on the counting result signal 370.

Next, the first bias generation circuit 250 and the second bias generation circuit 270 will be explained.

Figure 9:
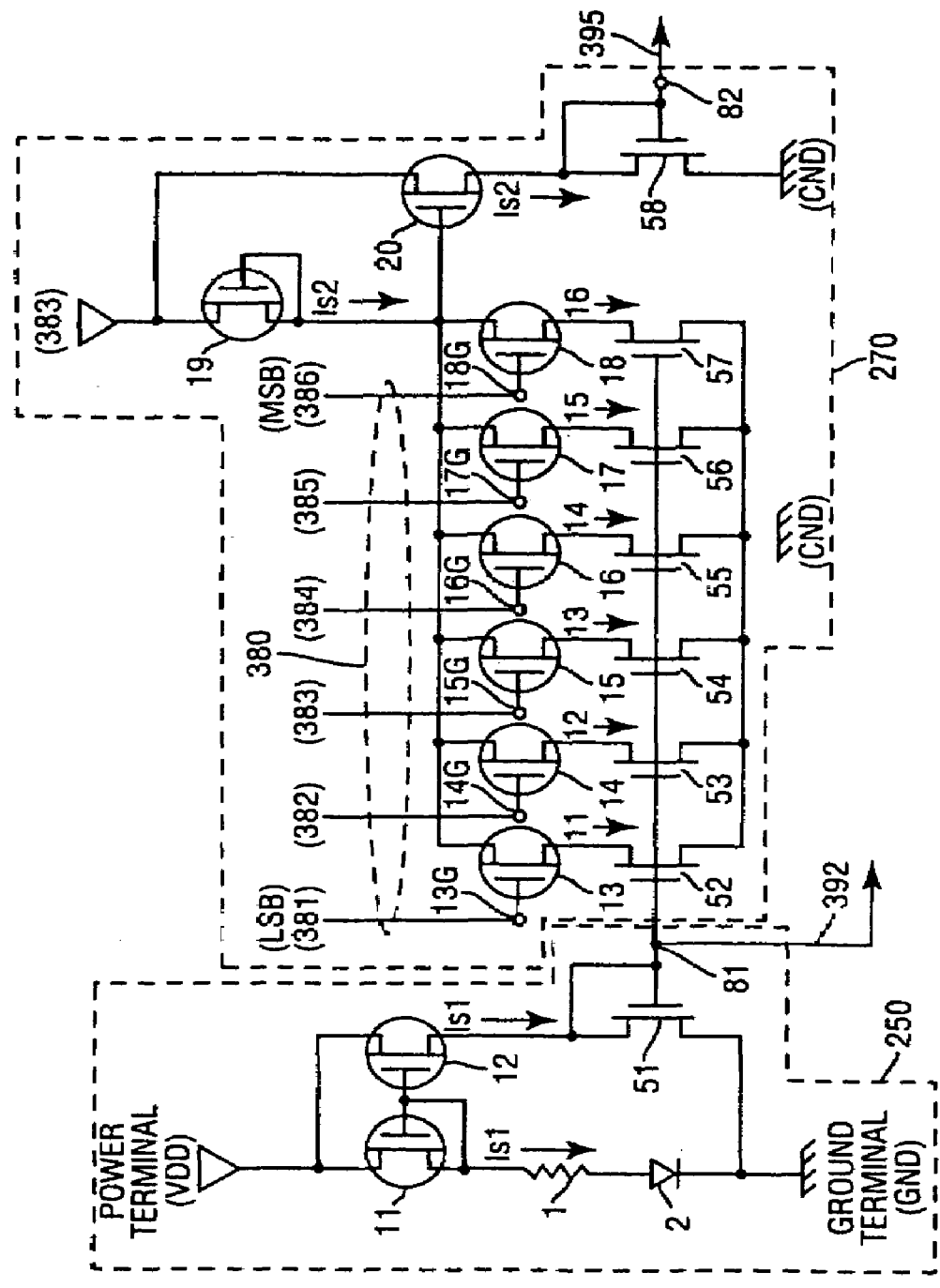
FIG. 9 is a diagram showing an embodiment of first and second bias generation circuits shown in FIG. 8.

FIG. 9 is a circuit diagram showing an embodiment of the first and second bias generation circuits 250, 270 shown in FIG. 8.

With reference now to FIG. 9, the first bias generation circuit 250 included in the DLL circuit 100 according to this preferred embodiment comprises, for example, two PMOSs 11, 12, a resistive element 1, a diode 2, and NMOS 51 which are connected as follows.

Each source electrode terminal of PMOSs 11, 12 is connected to a power terminal (hereinafter referred to as "VDD"). Each gate electrode terminal of the PMOSs 11, 12, a drain electrode terminal of PMOS 11, and a first electrode terminal of the resistive element 1 are connected by common connection. A second electrode terminal of the resistive element 1 and an anode electrode terminal of the diode 2 are connected by common connection. A cathode electrode terminal of the diode 2 is connected to a ground terminal (hereinafter referred to as "GND") A drain electrode terminal of PMOS 12, an output terminal 81 of the first bias generation circuit 250, a drain electrode terminal of NMOS 51, and a gate electrode terminal of NMOS 51 are connected by common connection. A source electrode terminal of NMOS 51 is connected to the ground terminal. PMOSs 11, 12 constitute a current mirror, and the resistance value of the resistive element 1 is set so that a constant current of a predetermined value Is1 flows into PMOSs 11, 12. A primary bias signal 392 determined by the constant current or a value Is1 and NMOS 51 is output from the first bias generation circuit 250.

The second bias generation circuit 270 comprises, for example, eight PMOSs 13 to 20 and seven NMOSs 52 to 58 which are connected as follows.

All of each source electrode terminal of a group of current regulation PMOSs composed of 6 PMOSs 13 to 18, a drain electrode terminal of PMOS 19, and each gate electrode terminal of PMOSs 19, 20 are connected by common connection. Each source electrode terminal of PMOSs 19, 20 is connected to VDD. Each drain electrode terminal of the group of current regulation PMOSs and each drain electrode terminal of a group of current regulation NMOSs composed of 6 NMOSs 52 to 57 are connected by common connection in a combination of PMOS 13 with NMOS 52, a combination of PMOS 14 with NMOS 53, a combination of PMOS 15 with NMOS 54, a combination of PMOS 16 with NMOS 55, a combination of PMOS 17 with NMOS 56, and a combination of PMOS 18 with NMOS 57. Each gate electrode terminal of the group of current regulation NMOSs is connected to the output terminal 81 of the first bias generation circuit 250. Each source electrode terminal of the group of current regulation NMOSs is connected to GND. A drain electrode terminal of PMOS 20, a drain electrode terminal and a gate electrode terminal of NMOS 58, and an output terminal 82 of the second bias generation circuit 270 are connected by common connection. A source electrode terminal of NMOS 58 is connected to GND. Gate electrode terminals 13G to 18G of the group of current regulation PMOSs are connected respectively to corresponding output signal terminals of the correction signal generation means 216 shown in FIG. 8 so that bias correction signals 381 to 386 are input respectively into the gate electrode terminals 13G to 18G.

In a group of six transistor pairs, PMOS 13/NMOS 52 pair, PMOS 14/NMOS 53 pair, PMOS 1S/NMOS 54 pair, PMOS 1/NMOS 55 pair, PMOS 17/NMOS 56 pair, and PMOS 18/NMOS 57 pair, the size of each transistor is set so that, when the primary bias signal 392 has been applied to each gate electrode of the group of current regulation NMOSs to bring them to a conducting state and a low level signal has been applied to each gate electrode of the group of current regulation PMOSs to bring them to a conducting state, for example, the following requirements are met: I1:I2:I3:I4:I5:I6=1:2:4:8:16:32, and I6=Is1 wherein 11 to16 are respectively values of current which flow through a path of PMOS 13/NMOS 52 pair, a path of PMOS 14/NMOS 53 pair, a path of PMOS 15/NMOS 54 pair, a path of PMOS 16/NMOS 55 pair, a path of PMOS 17/NMOS 56 pair, and a path of PMOS 18/NMOS 57 pair. More specifically, this can be realized, for example, by performing setting so as to meet the following requirements Wn0=Wn6, and I1:I2:I3:I4:I5: I6=Wn1:Wn2:Wn3:Wn4:Wn5:Wn6, wherein Wn0, Wn1, Wn2, Wn3, Wn4, Wn5, and Wn6 respectively represent the gate widths (W) of the NMOSs 51 to 57.

For example, when Wn0=320 μm, Wn0, Wn1, Wn2, Wn3, Wn4, Wn5, and Wn6 may be 10 μm, 20 μm, 40 μm, 80 μm, 160 μm, 320 μm, respectively.

In this case, the gate widths of the PMOSs 13 to 18 such that set values of current flow respectively into the NMOSs 51 to 57, suffice for contemplated results. Therefore, for example, the gate width may be substantially equal to the gate width Wn0 of NMOS 51.

PMOSs 19, 20 constitute a current mirror, and the value Is2 of the constant current, which flows through PMOS 19, 20, is the sum of current values of the transistor pair including PMOS, into which a low level signal sent from the correction signal generation means 216 is input, among the group of 6 transistor pairs. An internal bias signal 395 determined by the constant current of value Is2 and NMOS 58 is output from the second bias generation circuit 270.

Therefore, when NMOS 51, in the first bias generation circuit 250, as an output transistor for outputting the primary bias signal 392 and NMOS 58, in the second bias generation circuit 270, as an output transistor for outputting the internal bias signal 395 have the same size as each constant-current source transistor included in the DLL circuit 100, a constant current of value Is1 and a constant current of value Is2 can be allowed to flow respectively into the constant-current source transistor, into which the primary bias signal 392 has been input, and the constant-current source transistor, into which the internal bias signal 395 has been input.

Next, the construction of the counting control means 220 will be explained.

Figure 10:
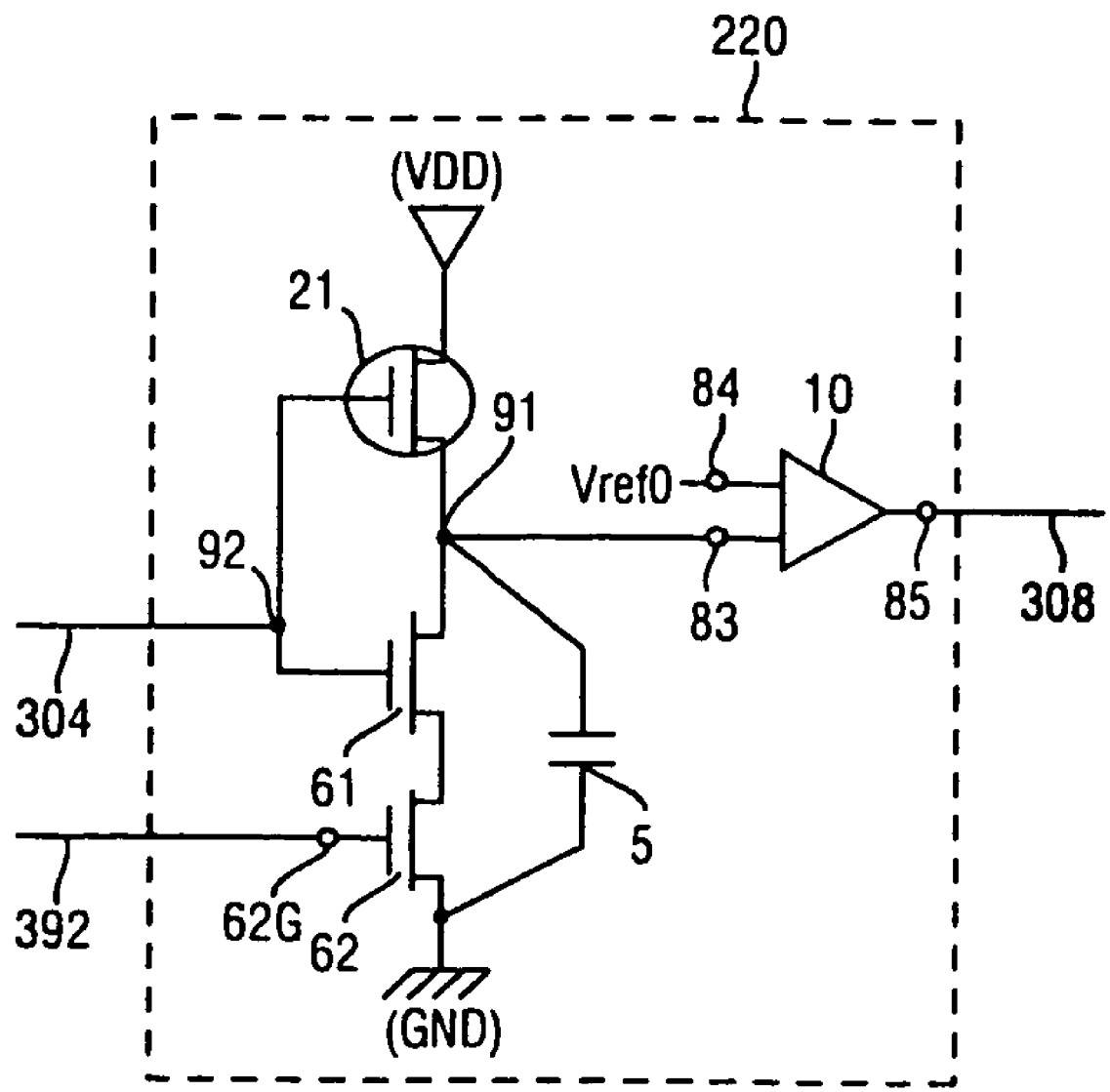
FIG. 10 is a circuit diagram showing an embodiment of counting control means shown in FIG. 8.

FIG. 10 is a circuit diagram showing an embodiment of the counting control means 220. With reference now to FIG. 10, the counting control means 220 comprises, for example, PMOS 21, a first NMOS 61, a second NMOS 62, a capacitative element 5, and a comparison circuit 10 which are connected as follows.

A source electrode terminal of PMOS 21 is connected to VDD. A drain electrode terminal of PMOS 21, a drain electrode terminal of the first NMOS 61, a first input terminal 83 of the comparison circuit 10, and a first electrode terminal of the capacitative element 5 are connected by common connection at a common connection point 91. A gate electrode terminal of PMOS 21 and a gate electrode terminal of the first NMOS 61 are connected by common connection at a common connection point 92. A source electrode terminal of the first NMOS 61 and a drain electrode terminal of the second NMOS 62 are connected by common connection. A source electrode terminal of the second NMOS 62 and a second electrode terminal of the capacitative element 5 are connected to GND. A gate electrode terminal 62G of the second NMOS 62 is connected to the output terminal 81 of the first bias generation circuit 250 so that the primary bias signal 392 is input into the second NMOS 62. The common connection point 92, at which the gate electrode terminal of PMOS 21 and the gate electrode terminal of the first NMOS 61 are connected by common connection, is connected to an output terminal (not shown) for outputting the first counting control signal 304 of the control circuit 212. A second input terminal 84 of the comparison circuit 10 is connected to a terminal (not shown) for a reference signal of a predetermined potential Vref0 (generally about 1 V).

FIG. 14 is a diagram illustrating major signals associated with the counting control means 220, wherein (a) represents a typical timing chart for the first counting control signal 304, (b) represents a typical timing chart for a potential Vct at the common connection point 91, (c) represents a typical timing chart for the second counting control signal 308, and (d) represents a typical timing chart of the counting result signal 370 in FIG. 8.

Figure 11A:
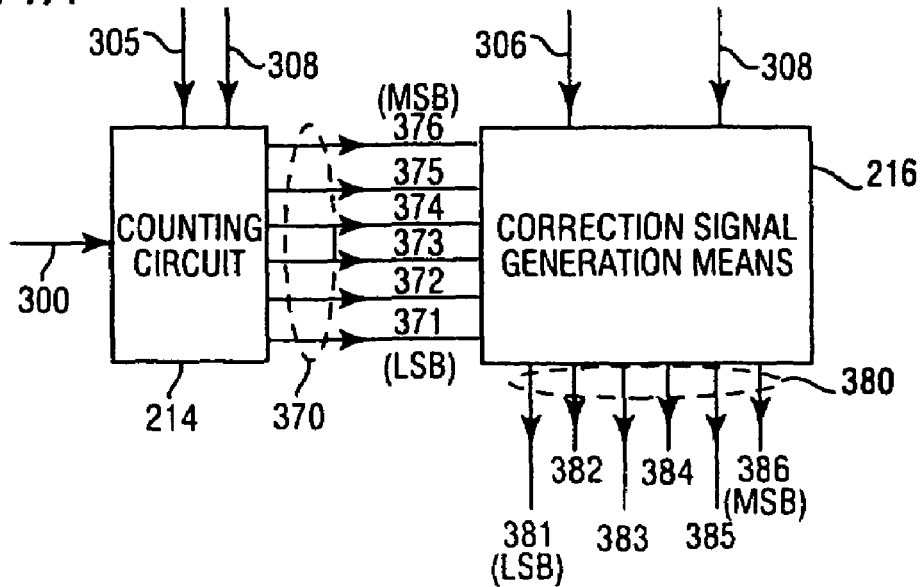
FIG. 11A is a schematic block diagram of the counting circuit and the correction signal generation means and FIG. 11B a graph showing an example of the relationship between the results of counting by the counting circuit and the value of current which flows through PMOS in a second bias generation circuit.
Figure 11B:
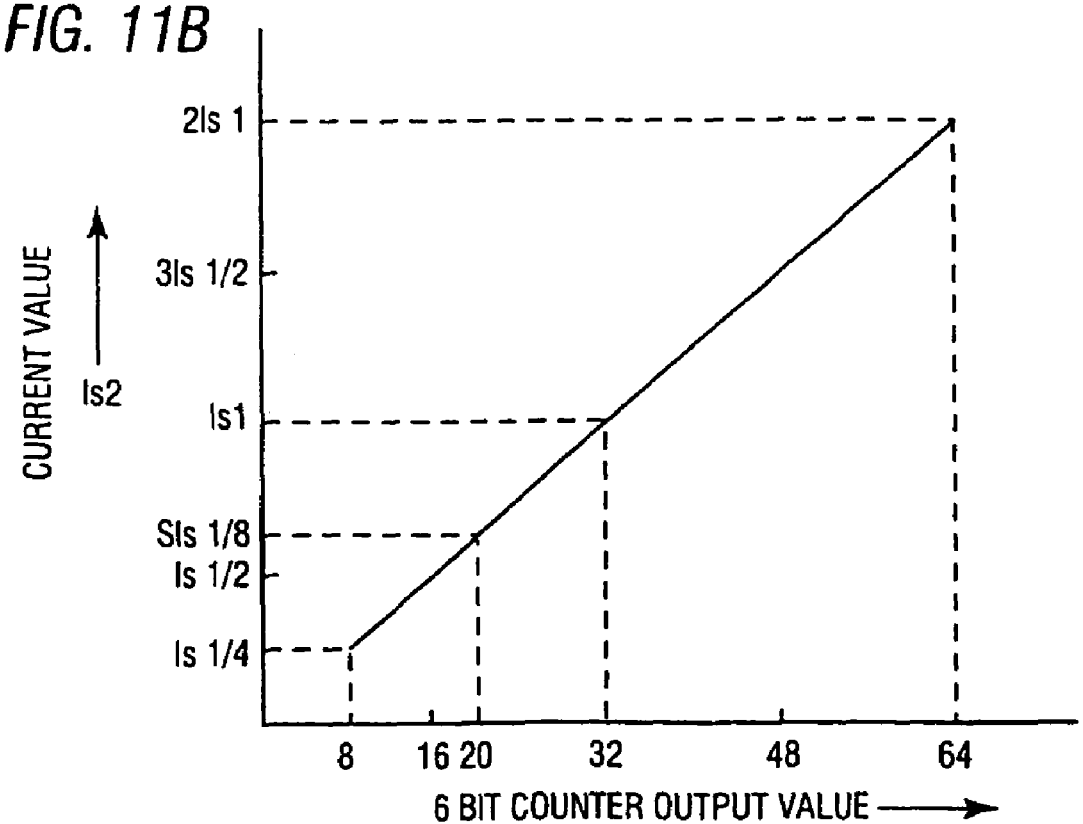

The counting circuit 214 and the correction signal generation means 216 will be briefly explained. FIG. 11 is a diagram illustrating a counting circuit 2141d correction signal generation means 216, wherein FIG. 11A is a schematic block diagram of the counting circuit 214 and the correction signal generation means 216 and FIG. 11B a graph showing an example of the relationship between the results of counting by the counting circuit 214 and the value Is2 of current which flows through PMOS 19 in the second bias generation circuit 270.

Here it is assumed that the counting circuit 214 comprises a 6 bit counter and the minimum current value Imin, at which the differential amplifier circuit included in the DLL circuit 100 can be normally operated, is Is1/4.

With reference now to FIG. 11, the counting circuit 214 in this preferred embodiment starts the counting of the input signal 300 in response to the first counting control signal 305 sent from the control circuit 212, stops the counting of the input signal 300 in response to the second counting control signal 308 sent from the counting control means 220, and outputs the results of counting as a 6-bit counting result signal 370.

Next, in response to the counting result signal 370 output from the counting circuit 214, the correction signal generation means 216 performs predetermined decision processing, and sends a bias correction signal 380 to the second bias generation circuit 270. Regarding output terminals (not shown) for outputting the bias correction signal 380 in the correction signal generation means 216, terminals for outputting bit signals of the least significant bit (LSB) signal 381 to the most significant bit (MSB) signal 386 are connected respectively to gate electrode terminals 13G to 18G of the second bias generation circuit 270. Corresponding bias correction signals are input respectively into the gate electrodes of PMOS 13 to PMOS 18 to correct the value Is2 of current which flows through PMOS 19.

The decision processing will be explained in more detail. As a result of the correction based on the results of counting, when the value Is2 of current, which flows through PMOS 19, is not less than the minimum current value Imin, at which the differential amplifier circuit included in the DLL circuit 100 can be normally operated, the counting result signal 370 as such is output as the bias correction signal 380. On the other hand, when Is2 is less than Imin, a bias correction signal 380, such that the current, which flows through PMOS 19, is brought to a minimum value of not less than Imin, is output independently of the results of counting. In this example, when the counting result is not less than "8," the counting result signal 370 as such is sent as the bias correction signal 380 to the second bias generation circuit 270. On the other hand, when the counting result is less than "8" the counting result is indiscriminately regarded as "8" and the bias correction signal 380 is generated based on this and is sent to the second bids generation circuit 270. In this example of the present preferred embodiment, a bit signal 384 is a low level signal, while the other bit signals 381 to 383, 385, and 386 are high level signals. That is, the relationship between the results of counting in the counting circuit 214 and the value Is2 of current, which flows into PMOS 19 in the second bias generation circuit 270, is as shown in a graph in FIG. 11B.

Next, the operation of the bias generation means 200, which is a feature of the invention, will be explained in conjunction with FIGS. 7 to 11 and 14.

The control circuit 212 is set so that, as soon as a power supply of the DLL circuit 100 is put to work, the control circuit 212 outputs a signal on a predetermined level according to a circuit or means which receives a signal sent from the control circuit 212. In this preferred embodiment, a low level signal is output from at least the terminal for outputting the first counting control signal 304. This turns on PMOS 21 and turns off the first NMOS 61 in the counting control means 220, and the capacitative element 5 is charged to the power voltage (Vdd).

Next, upon the input of a predetermined trigger signal 302 such as a reset signal into the control circuit 212, the first counting control signals 304, 305, 306 are output. In the present preferred embodiment, at least the first counting control signal 304 outputs a high level signal.

The counting circuit 214 in this preferred embodiment is composed of a 6-bit counter, and, upon the receipt of the first counting control signal 305, starts the counting of the input signal 300. Upon the receipt of the first counting control signal 306, the correction signal generation means 216 generates a bias correction signal 380, which renders the internal bias signal 395 equal to the primary bias signal 392, and sends the bias correction signal 380 to the second bias generation circuit 270. In this case, a bias correction signal 380 corresponding to the counting result "32" (only the MSB signal 386 is a low level signal while all the other bit signals 381 to 385 are high level signals) is sent.

Upon the receipt of the first counting control signal 304 on a high level, in the counting control means 220, FMOS 21 is turned off, and the first NMOS 61 is turned on, The gate electrode terminal 62G of the second NMOS 62 is connected to the output terminal 81 of the first bias generation circuit 250, and the primary bias signal 392 is applied to the gate electrode of the second NMOs 62. Therefore, charges in the capacitative element 5 are discharged through the first and second NMOSs 61, 62, and the potential Vct of the common connection point 91, at which the first input terminal 83 of the comparison circuit 10 is connected, is gradually lowered.

When the potential Vct is lowered to a value below the potential Vref0 input into the second input terminal 84 of the comparison circuit 10, the potential at the output terminal 85 of the comparison circuit 10 is reversed and the second counting control signal 308 is output. The counting time Tct, defined as a time elapsed until, after the receipt of the first counting control signal 304, the second counting control signal 308 is output, is determined by the discharge rate of charges in the capacitative element 5. The discharge rate is determined depending upon the primary bias signal 392.

Upon the output of the second counting control signal 308 from the comparison circuit 10, the courting circuit 214 stops the counting of the input signal 300, and outputs the counting result as a 6-bit counting result signal 370. Upon the receipt of the second counting control signal 308, the correction signal generation means 216 fetches the counting result signal 370, performs the above-described predetermined decision processing, and outputs the bias correction signal 380.

For example, when the counting result is "20," the bit signals 383, 385 are low level signals, while the other bit signals 381, 382, 384, 386 are high level signals. That is, among the group of current regulation PMOSs, only PMOSs 15, 17 become a conducting state, and, thus, Is2=I3+I5=(5 Is1/8). The internal bias signal 395 determined by the current value Is2 and NMOS 58 is supplied to the transistor gate electrode as each constant-current source included in the DLL circuit 100.

The bias control means 210 included in the bias generation means 200 according to this preferred embodiment counts the input signal by a time determined depending upon the primary bias signal 392 generated in the first bias generation circuit 250, and, based on the counting result, generates, in the second bias generation circuit 270, the internal bias signal 395 to be supplied to each constant-current source included in the DLL circuit 100, The internal bias signal 395 generated by the second bias generation circuit 270 is corrected so that the current value of the constant-current source decreases with decreasing the counting result of the counting circuit 214.

As is apparent from the construction the counting control means 220, since the counting time Tct is constant independently of the input signal 300, the counting result decreases with decreasing the frequency of the input signal 300 and the current value of each constant-current source included in the DLL circuit 100 can be automatically lowered according to the frequency of the input signal 300. Further, control is performed by the correction signal generation means 216 so that, even when the frequency of the input signal 300 has been significantly lowered, the current value Is2, which flows into each constant-current source by the corrected internal bias signal 395, is not lowered to a value below the minimum current value necessary for the normal operation of the differential amplification circuit. There is no fear of causing a failure of operation of the differential amplifier circuit due to an operating current shortage.

Further, the counting time Tct is determined depending upon the primary bias signal 392. Therefore, when the resistance value of elements of the first bias generation circuit 250, particularly the resistive element 1, is shifted from the designed value, for example, to a higher value to reduce Is1, the level of the primary bias signal 392 is also lowered and the value of current, which flows into NMOS 62 located in the discharge path of the capacitative element 5 included in the counting control means 220 shown in FIG. 10, is also lowered, so that the counting time Tct is increased. For this reason, even when the frequency of the input signal 300 is identical, the counting result of the counting circuit 214 is increased. On the other hand, when the resistance value of the resistive element 1 is shifted to a lower value to increase Is1, the counting time Tct is decreased and the counting result of the counting circuit 214 is decreased.

That is, regarding the internal bias signal 392 generated in the second bias generation circuit 270, even when some deviation from the designed value has taken place in the primary bias signal 392, the counting time Tct is automatically corrected according to the deviation and correction, while taking into consideration the deviation of the primary bias signal 392, to a proper level can be achieved.

Next, the DLL circuit according to the second preferred embodiment of the invention will be explained.

Figure 12:
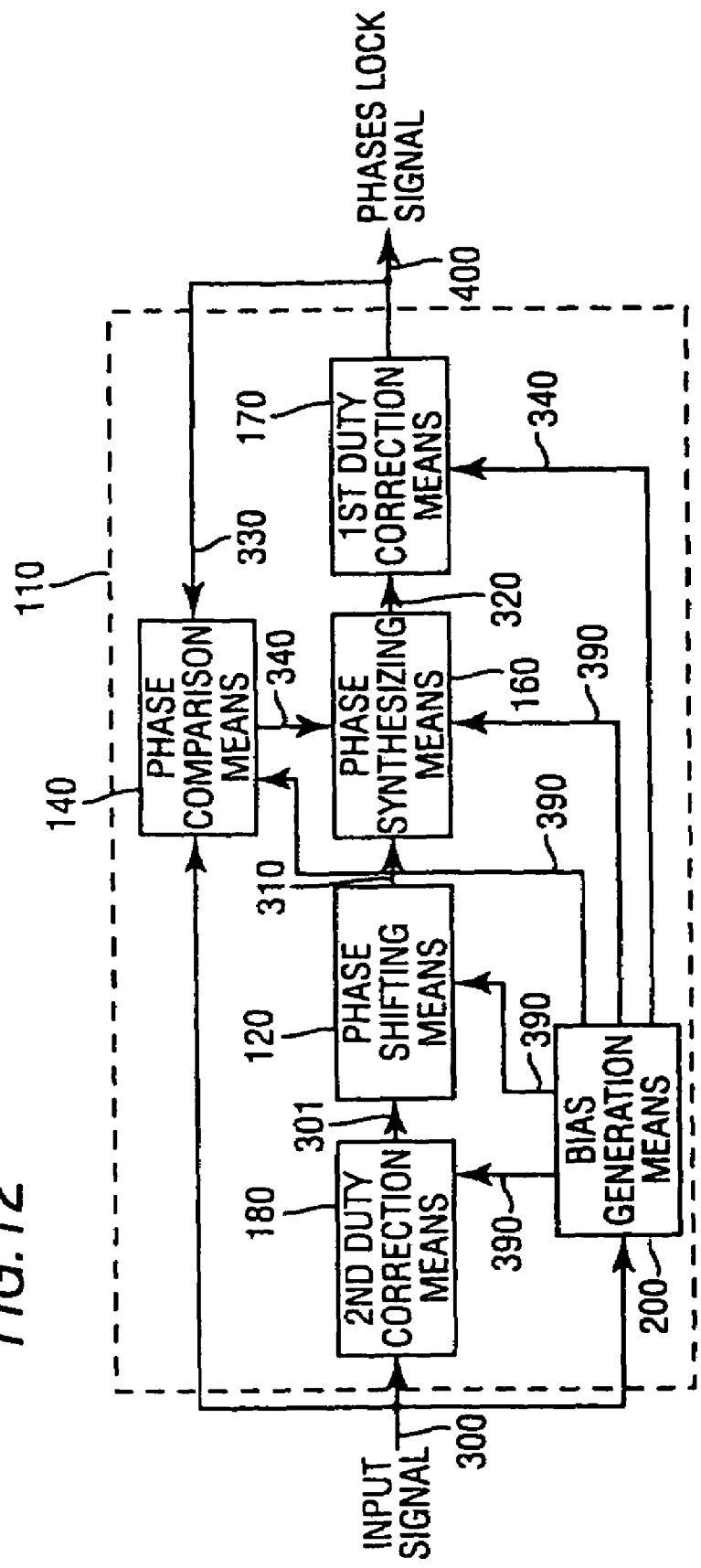
FIG. 12 is a block diagram showing a DLL circuit according to a second preferred embodiment of the invention.

FIG. 12 is a block diagram of a DLL circuit 110 according to the second preferred embodiment.

With reference now to FIG. 12, the DLL circuit 110 according to this preferred embodiment comprises second duty correction means 180 which corrects the duty of the input signal 300 to a predetermined duty value (for example, 49 to 51%) and Output % a duty corrected signal 301; phase shifting means 120 for generating m phase shift processing signals 310 different from each other in phase based on the duty corrected signal 301; phase comparison means 140 which compares the phase of the input signal 300 with the phase of the feedback signal 330 from the output to detect a phase difference and, based on the detected phase difference, outputs a phase control signal 340; phase synthesizing means 160 for outputting a phase corrected signal 320 having a predetermined phase relationship with the input signal 300 based on the m phase shift processing signals 310, produced by the phase shifting means 120, and the phase control signal 340; and first duty correction means 170 which again corrects the duty of the phase corrected signal 320 to a predetermined duty and outputs a phase lock signal 400. Further, the DLL circuit 110 is provided with bias generation means 200 for controlling the current value of a constant-current source in a differential amplifier circuit included in each of these means.

The DLL circuit 110 according to this preferred embodiment is different from the DLL circuit 100 according the first preferred embodiment only in that, in the DLL circuit 110 according to this preferred embodiment, the second duty correction means 180 for correcting the duty of the input signal 300 to a predetermined duty is provided before the phase shifting means 120. Therefore, the detailed explanation of this embodiment will be omitted. According to the DLL circuit 110 in this preferred embodiment, previously correcting the duty of the input signal 300 can advantageously realize phase regulation with higher accuracy.

Next, the DLL circuit according to the third preferred embodiment of the invention will be explained.

In the DLL circuits 100, 110 according to the first and second preferred embodiments, the current value of the constant-current source of each differential amplifier circuit is brought to a current value Is2 determined by the internal bias signal 395 corrected by the bias generation means 200 according to the frequency of the input signal 300. On the other hand, in the DLL circuit according to this preferred embodiment, the current value of the constant-current source in a specific differential amplifier circuit is brought to a constant current value independently of the frequency of the input signal 300.

Specifically, the basic construction, including the internal construction of the bias generation means 200, of the DLL circuit according to this preferred embodiment is the same as that of the DLL circuits 100, 110 according to the first and second preferred embodiments, except that the primary bias signal 392 is supplied to the constant-current source in the final-stage differential amplifier circuit in each functional block.

Figure 13:
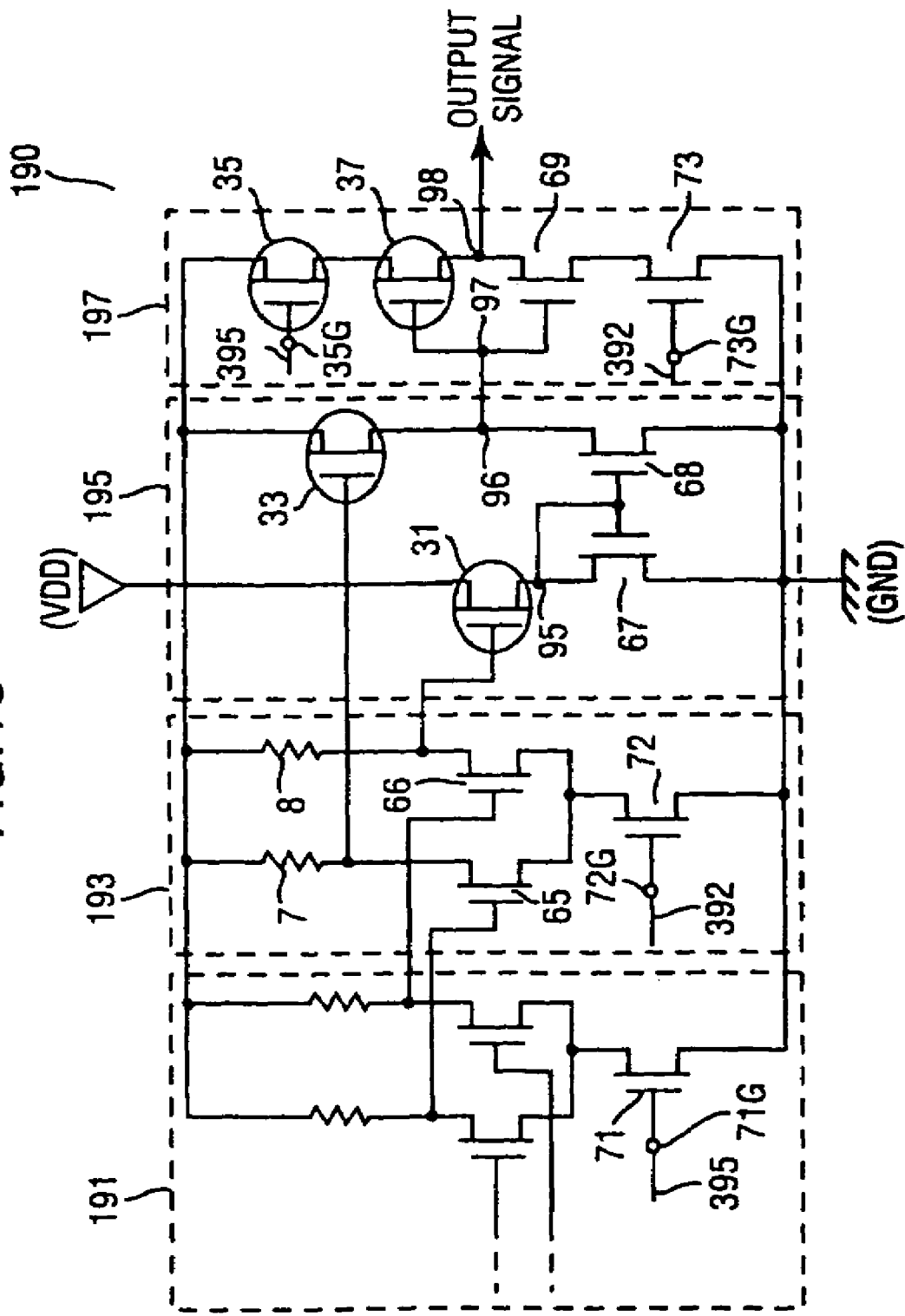
FIG. 13 is a typical circuit diagram of one functional block in its final stage portion included in the DLL circuit according to the invention.

For example, FIG. 13 is a typical circuit diagram of the final stage of one functional block 190 included in the DLL circuits 100, 110. This functional block 190 comprises an internal processor 191; a final-stage differential amplifier circuit 193; a level converter 195; and a signal output section 197.

In this case, a gate electrode terminal 71G of NMOS 71 as a constant-current source of the differential amplifier circuit included in the internal processor 191 is connected to an output terminal 82 of the second bias generation circuit 270 so that an internal bias signal 395 is applied.

The final-stage differential amplifier circuit 193 comprises resistive elements 7, 8 and NMOSs 65, 66, 72. Each first terminal of the resistive elements 7, 8 is connected to VDD. A second terminal of the resistive element 7 is connected to a drain electrode terminal of NMOS 65 by common connection, and a second terminal of the resistive element 8 is connected to a drain electrode terminal of NMOS 66 by common connection. Each source electrode terminal of MNOSs 65, 66 and a drain electrode terminal of NMOS 72 are connected by common connection. A source electrode terminal of NMOS 72 is connected to GND. The resistive elements 7, 8 and NMOS 65, 66 constitute a differential amplifier, and the NMOS 72 functions as a constant-current source. A gate electrode terminal 72G of NMOS 72 as the constant-current source is connected to the output terminal 81 of the first bias generation circuit 250 so that a primary bias signal 392 is applied.

That is, according to this construction, since the primary bias signal 392 nor dependent upon the input signal frequency is applied to the gate electrode of NMOS 72 as the constant-current source of the final-stage differential amplifier circuit 193 in the functional block included in the DLL circuit according to this preferred embodiment, the final-stage differential amplifier circuit 193 can be reliably operated even at a low input signal frequency.

Next, the DLL circuit according to the fourth preferred embodiment of the invention will be explained.

The basic construction of the DLL circuit according to this preferred embodiment is the same as that of the DLL circuits according to the first to third preferred embodiments, except that at least the signal output section of the first duty correction means 170 for outputting the phase lock signal 400 has a construction shown in FIG. 13. Specifically, the first duty correction means 170 included in the DLL circuit according to the present preferred embodiment comprises an internal processor 191, a final-stage differential amplifier circuit 193, a level converter 195, and a signal output section 197. The internal processor 191 and the final-stage differential amplifier circuit 193 are the same as those in the third preferred embodiment, and, hence, the explanation thereof will be omitted.

The level converter 195 comprises a first PMOS 31, a second PMOS 33, a third NMOS 67, and a fourth NMOS 68. Each source electrode terminal of the first PMOS 31 and the second PMOS 33 is connected to VDD. A drain electrode terminal of the first PMOS 31, a gate electrode terminal of the third NMOs 67, a gate electrode terminal of the fourth NMOS 68, and a drain electrode terminal of the third NMOS 67 are connected by common connection at a common connection point 95. A drain electrode terminal of the second PMOS 33 and a drain electrode terminal of the fourth NMOS 6B are connected by common connection at a common connection point 96. Each of a source electrode terminal of the third NMOs 67 and a source electrode terminal of the fourth NMOS 68 is connected to GND. The third NMOS 57 and the fourth NMOS 68 constitute a current mirror. A differential signal output from the final-stage amplifier circuit 193 is input into each gate electrode of the first PMOS 31 and the second PMOS 33, and a level change signal is sent from the common connection point 96 of the second PMOS 33 and the fourth NMOS 68.

The signal output section 197 comprises a third PMOS 35, a fourth PMOS 37, a fifth NMOS 69, and a sixth NMOS 73. A source electrode terminal of the third PMOS 35 is connected to VDD, and a source electrode terminal of the sixth NMOS 73 is connected to GND. A drain electrode terminal of the third PMOS 35 is connected to a source electrode terminal of the fourth PMOS 37 by common connection A drain electrode terminal of the fourth PMOS 37 and a drain electrode terminal of the fifth NMOS 69 are connected by common connection at a common connection point 98. A source electrode terminal of the fifth NMOS 69 and a drain electrode terminal of the sixth NMOS 73 are connected by common connection. Further, a gate electrode of the fourth PMOS 37 and a gate electrode of the fifth AMOS 69 are connected by common connection at a common connection point 97, and the common connection point 97 is connected to the common connection point 96 of the level converter 195. An output signal of the functional block 190 is output from the common connection point 98 at which the drain electrode terminal of the fourth PMOS 37 and the drain electrode terminal of the fifth NMOS 69 are connected by common connection.

A gate electrode terminal 35G of the third PMOS 35 is connected to the output terminal 82 of the second bias generation circuit 270, and a gate electrode terminal 73G of the sixth NMOS 73 is connected to the output terminal 81 of the first bias generation circuit 250, so that the internal bias signal 395 and the primary bias signal 392 are applied respectively to the gate electrodes.

In the DLL circuit according to this preferred embodiment, the internal bias signal 395 is applied to the gate electrode of the third PMOS 35 constituting at least the signal output section 197 included in the first duty correction means 170, and the primary bias signal 392 is applied to the gate electrode of the sixth NMOS 73. Therefore, when the level of the internal bias signal 395 has been lowered, the reversing threshold value of the signal output section 197 is substantially increased. Thus, even when the current value of the constant-current source of the internal processor 191 is lowered due to a lowering in frequency of the signal 300 input into the DLL circuit and the level of the operation point (a cross point of operating waveform which is a center of signal waveform) of the differential amplifier circuit in the internal processor 191 is increased, the reversing threshold value of the signal output section 197 is also substantially increased By virtue of this, the signal output section 197 is reliably operated, and the output signal can be brought to a full swing waveform on a CMOS level. Thus, signal send/receive operation between functional blocks can be stably performed.

It is needless to say that the invention is not limited to the above preferred embodiments and various variations and modifications are possible within the subject matter of the invention. For example, the number of phase shifting processing signals, different from each other in phase, to be generated in the phase shifting means 120, the construction (including the numbers of bits of the counter) of the counting circuit 214, and the construction of the group or current regulation transistors included in the second bias generation circuit 270 may be suitably designed according to need.

The DLL circuit of the invention can automatically control the current value of a constant-current source of a differential amplifier circuit included in the DLL circuit to a proper value according to the frequency of the input signal, and, while coping with a wide range of input signal frequencies, can maintain stable operation and can efficiently reduce the power consumption of the circuit according to input signal frequencies.

Further, the supply of a primary bias signal not dependent upon the input signal frequency to at least a specific element, such as a constant-current source of the final-stage differential amplifier circuit in each functional block enables each functional block to be reliably operated independently of the input signal frequency.

In addition, when the signal output section is constructed so as to include a transistor controlled by an internal bias signal and a transistor controlled by a primary bias signal, the output signal can be reliably brought to a full swing waveform on a CMOS level and, thus, advantageously, signal send/receive operation between functional blocks can be stably performed.

REFERENCES IN FIGURES

Figure 1:
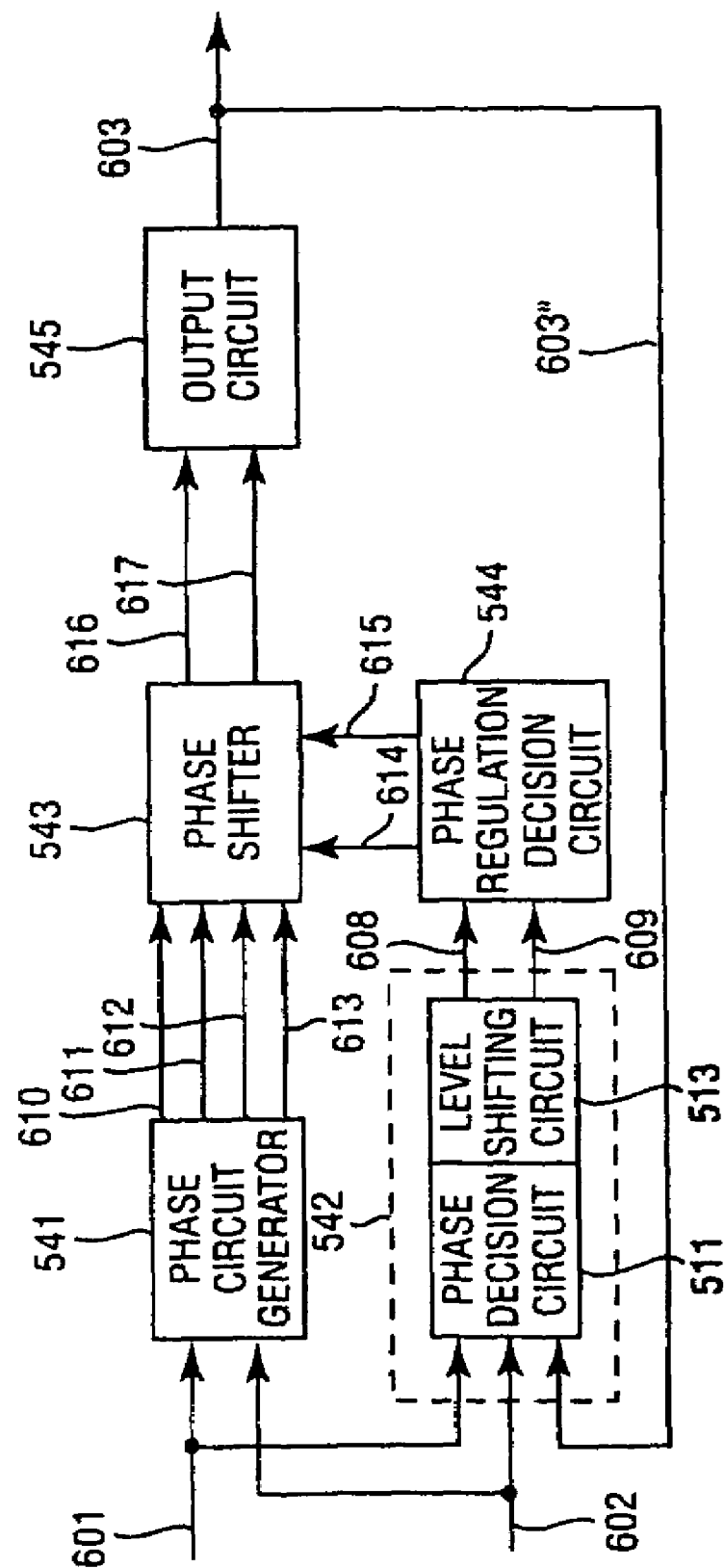
FIG. 1 is a block diagram showing the construction of a DLL circuit according to a first conventional technique.
Figure 2:
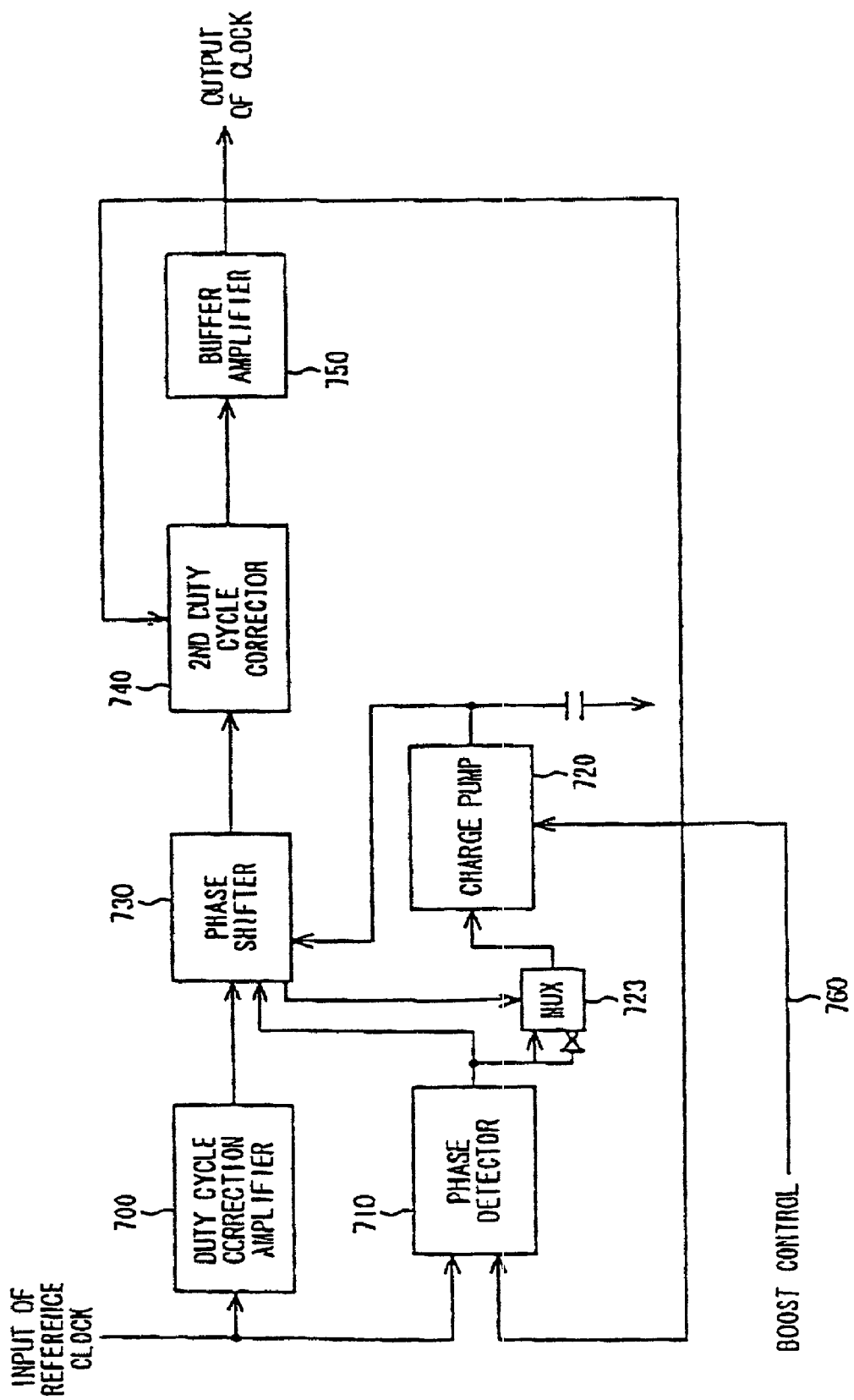
FIG. 2 is a block diagram showing the construction of a DLL circuit according to a second conventional technique.
Figure 3:
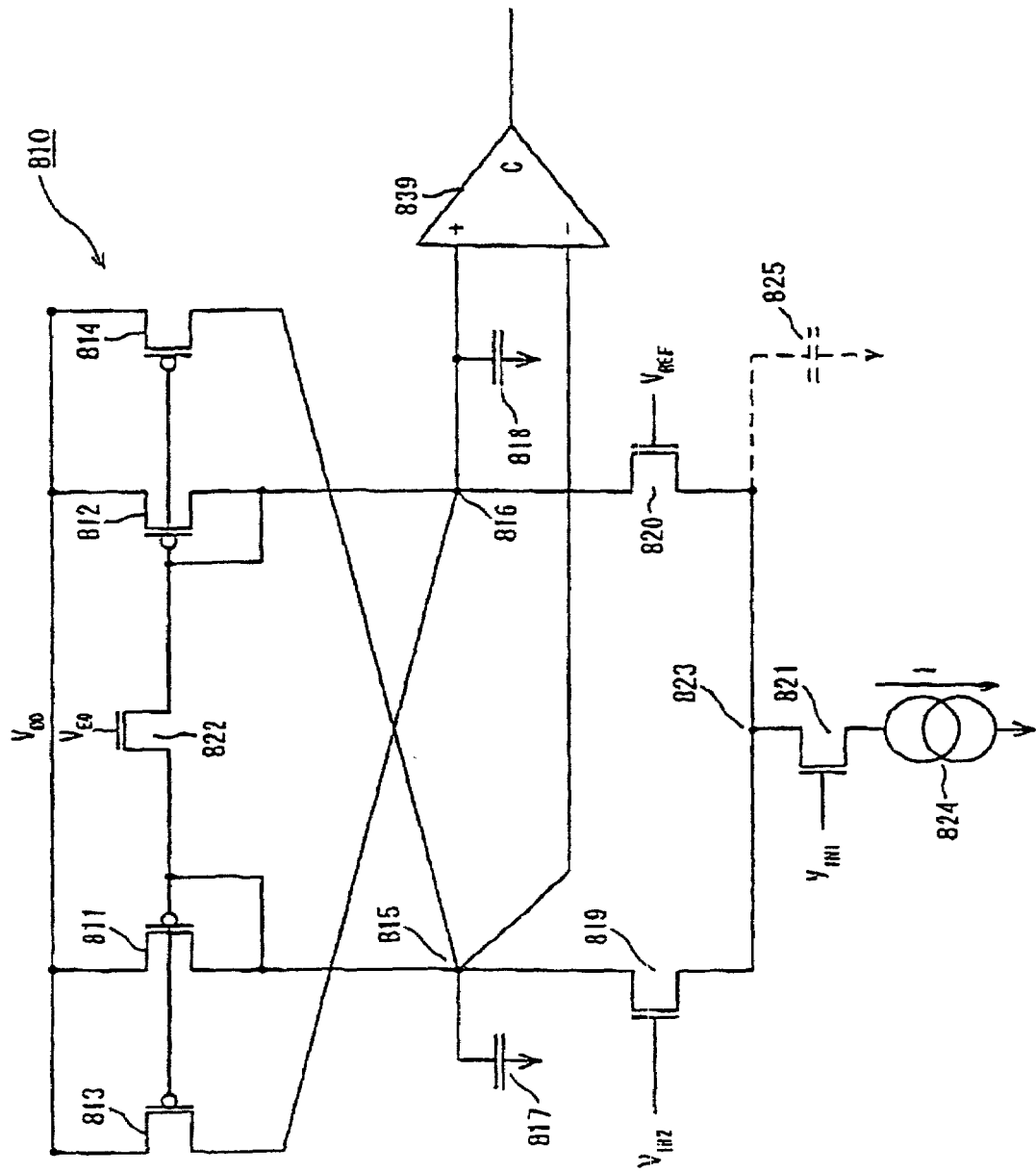
FIG. 3 is a circuit diagram of a phase detector as one major element in the DLL circuit according to the second conventional technique.
Figure 4:
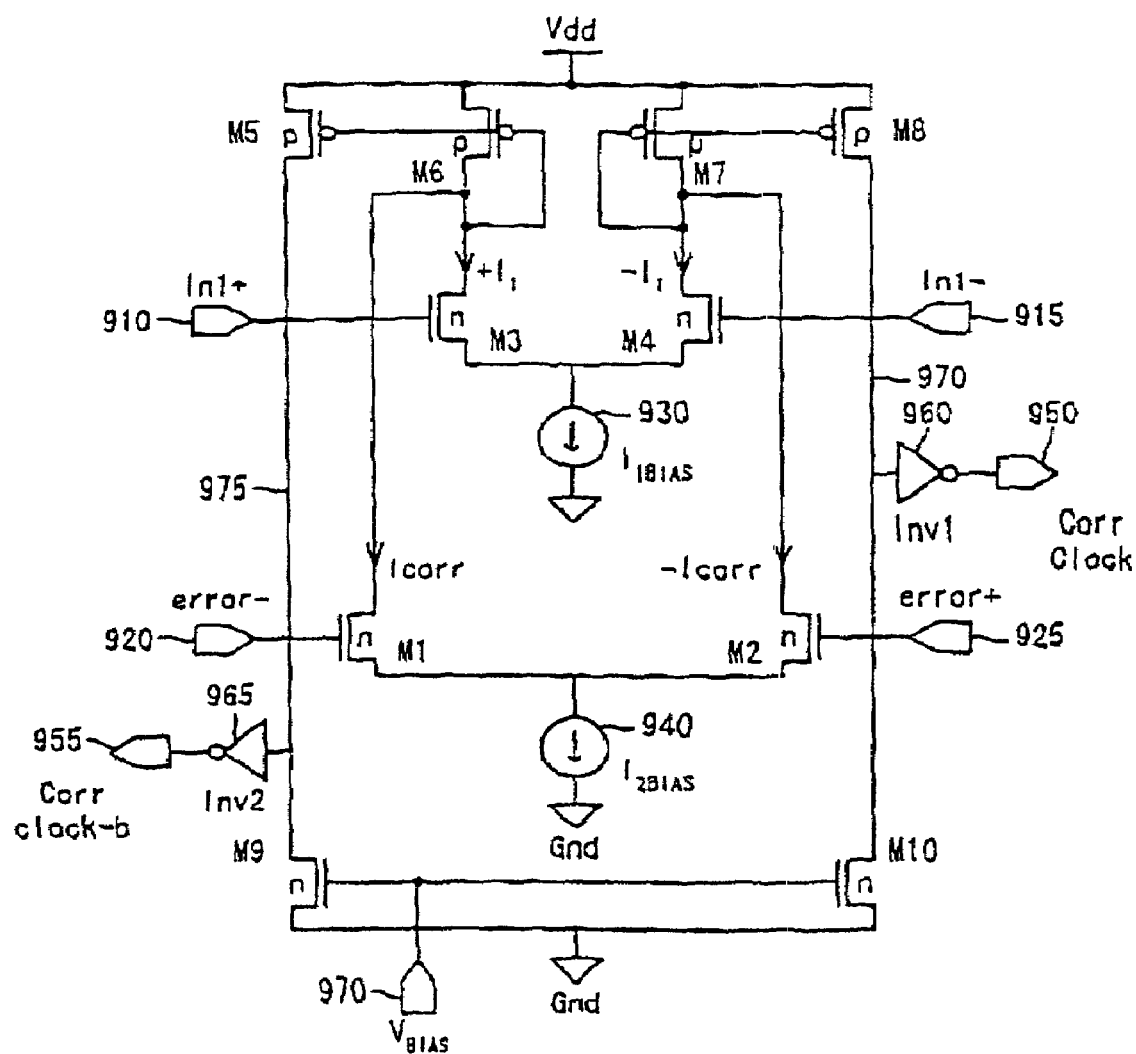
FIG. 4 is a circuit diagram of a duty cycle correction amplifier as another major element in the DLL circuit according to the second conventional technique.

FIG. 1:
511 PHASE DECISION CIRCUIT
513 LEVEL SHIFTING CIRCUIT
541 4-PHASE BASIC CLOCK GENERATION CIRCUIT
542 PHASE DETECTION CIRCUIT
543 PHASE SHIFTING CIRCUIT
544 PHASE REGULATION DECISION CIRCUIT
545 OUTPUT CIRCUIT
601 OUTPUT CLOCK
602 REFERENCE CLOCK
603 OUTPUT CLOCK
608, 609 CONTROL SIGNAL
610–617 SIGNAL
FIG. 2:
723 MUX (MULTIPLEXOR)
FIG. 3:
810 PHASE DETECTOR
811–814 P-CHANNEL TRANSISTOR
815, 816 NODE
817, 818 CAPACITOR
819, 820, 821 N-CHANNEL TRANSISTOR
822 TRANSISTOR
823 NODE
824 CURRENT SOURCE
825 PARASITIC CAPACITY
839 COMPARATOR
$V_{IN1}$ INPUT SIGNAL
$V_{IN2}$ INPUT SIGNAL
$V_{DD}$ POWER TERMINAL
$V_{EQ}$ EQUALIZATION SIGNAL
$V_{REF}$ REFERENCE VOLTAGE
FIG. 4:
M1–M10 TRANSISTOR
910, 915 UNCORRECTED INPUT SIGNAL
920, 925 ERROR VALUE
930, 940 BIAS CURRENT
950, 955 CORRECTED DIFFERENTIAL CLOCK SIGNAL
960, 965 INVERTER
970, 975 NODE

Figure 5:
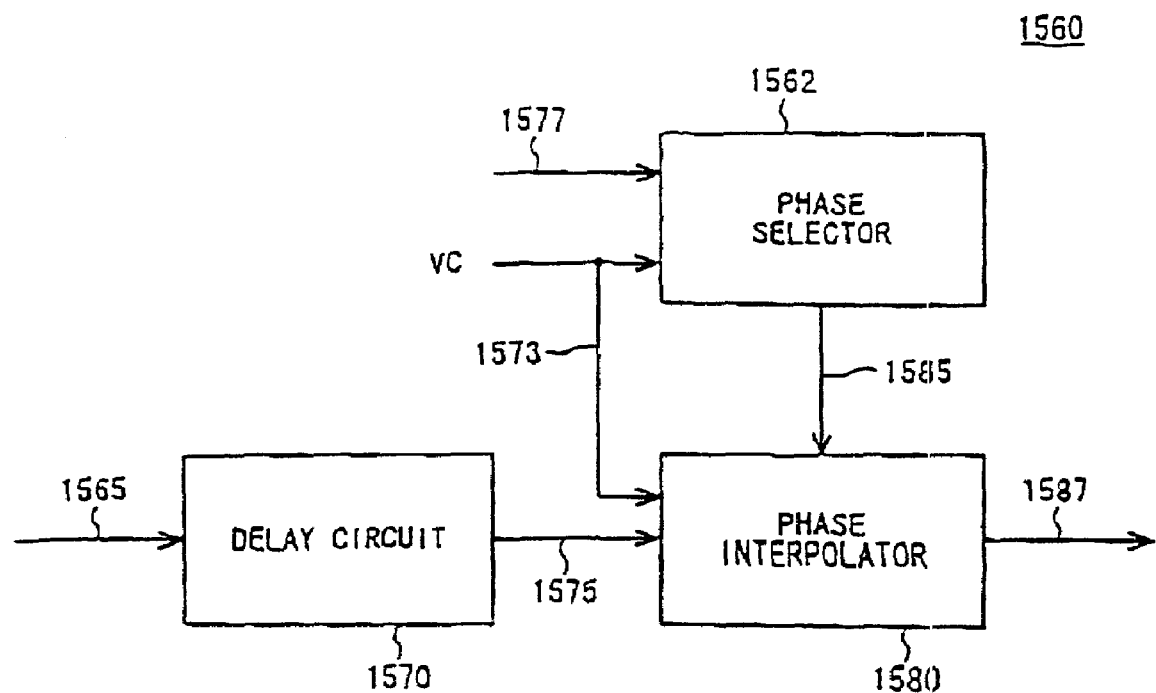
FIG. 5 is a block diagram of a phase shifter as a further element in the DLL circuit according to the second conventional technique.
Figure 6:
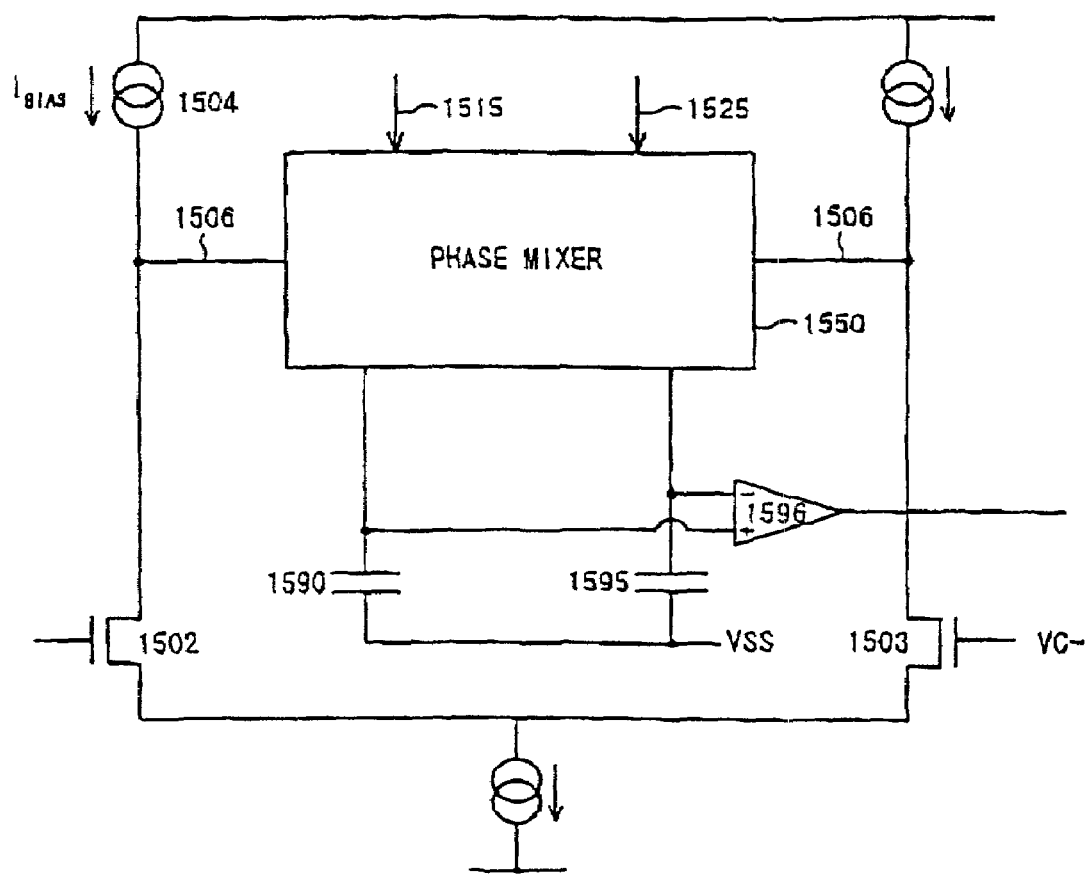
FIG. 6 is a block diagram showing a phase interpolator included in the phase shifter shown in FIG. 5.

GND GROUND TERMINAL
V$_{DD}$ POWER TERMINAL
FIG. 5:
1560 PHASE SHIFTER
1565 REFERENCE CLOCK
1573 CONSTANT-CURRENT SUPPLY LINE
1575 SIGNAL LINE
1577 RESULT OF PHASE DECISION
1585 PHASE SELECT SIGNAL
1587 OUTPUT CLOCK
FIG. 6:
1501 CURRENT SOURCE
1502, 1503 DIFFERENTIAL N-CHANNEL FIELD-EFFECT TRANSISTOR (FET)
1504, 1505 FIXED CURRENT SOURCE
1506, 1507 BRANCH
1515, 1525 SIGNAL LINE
1550 PHASE MIXER
1590, 1595 CAPACITOR
1596 AMPLIFIER
FIG. 7:
100 DLL CIRCUIT
310 PHASE SHIFTING PROCESSING SIGNAL
320 PHASE CORRECTED SIGNAL
330 FEEDBACK SIGNAL
340 PHASE CONTROL SIGNAL
390 BIAS SIGNAL
FIG. 8:
302 TRIGGER SIGNAL
304, 305, 306 FIRST COUNTING CONTROL SIGNAL
308 SECOND COUNTING CONTROL SIGNAL
370 COUNTING RESULT SIGNAL
380 BIAS CORRECTION SIGNAL
392 PRIMARY BIAS SIGNAL
395 INTERNAL BIAS SIGNAL
FIG. 9:
1 RESISTIVE ELEMENT
2 DIODE
11–20 PMOS (P-CHANNEL MOS)
I1–I6 CURRENT VALUE
13G–18G ELECTRODE TERMINAL
Is1 CURRENT VALUE
Is2 CURRENT VALUE
51–58 NMOS (N-CHANNEL MOS)
81, 82, OUTPUT TERMINAL
250 FIRST BIAS GENERATION CIRCUIT
270 SECOND BIAS GENERATION CIRCUIT
380 BIAS CORRECTION SIGNAL
381–386 CORRECTION SIGNAL
392 PRIMARY BIAS SIGNAL
395 INTERNAL BIAS SIGNAL
GND GROUND TERMINAL
VDD POWER TERMINAL
FIG. 10:
5 CAPACITATIVE ELEMENT
10 COMPARISON CIRCUIT
21 PMOS (P-CHANNEL MOS)
61 FIRST NMOS
62 SECOND NMOS
62G GATE ELECTRODE TERMINAL
83 FIRST INPUT TERMINAL
84 SECOND INPUT TERMINAL
85 OUTPUT TERMINAL
91 COMMON CONNECTION
92 COMMON CONNECTION
220 COUNTING CONTROL MEANS
304 FIRST COUNTING CONTROL SIGNAL
308 SECOND COUNTING CONTROL SIGNAL
392 PRIMARY BIAS SIGNAL
GND GROUND TERMINAL
VDD POWER TERMINAL
Vref POTENTIAL
FIG. 11A:
214 COUNTING CIRCUIT
300 INPUT SIGNAL
305, 306 FIRST COUNTING CONTROL SIGNAL
308 SECOND COUNTING CONTROL SIGNAL
370 COUNTING RESULT SIGNAL
371–376 OUTPUT BIT
380 BIAS CORRECTION SIGNAL
381 LEAST SIGNIFICANT BIT SIGNAL
382–385 BIT SIGNAL
386 MOST SIGNIFICANT BIT SIGNAL
FIG. 12:
110 DLL CIRCUIT
310 PHASE SHIFTING PROCESSING SIGNAL
320 PHASE CORRECTED SIGNAL
330 FEEDBACK SIGNAL
340 PHASE CONTROL SIGNAL
390 BIAS SIGNAL
FIG. 13:
7, 8 RESISTIVE ELEMENT
31 FIRST PMOS
33 SECOND PMOS
35 THIRD PMOS
35G ELECTRODE TERMINAL
37 FOURTH PMOS
65, 66 NMOS
67 THIRD NMOS
68 FOURTH NMOS
69 FIFTH NMOS
71 NMOS
71G GATE ELECTRODE TERMINAL
72 NMOS
72G GATE ELECTRODE TERMINAL
73 SIXTH NMOS
73G GATE ELECTRODE TERMINAL
95–98 COMMON CONNECTION
190 FUNCTIONAL BLOCK
191 INTERNAL PROCESSOR
193 FINAL STAGE DIFFERENTIAL AMPLIFIER CIRCUIT
195 LEVEL CONVERTER
197 SIGNAL OUTPUT SECTION
392 PRIMARY BIAS SIGNAL
395 INTERNAL BIAS SIGNAL
GND GROUND TERMINAL
VDD POWER TERMINAL
FIG. 14:
304 FIRST COUNTING CONTROL SIGNAL
308 SECOND COUNTING CONTROL SIGNAL
370 COUNTING RESULT SIGNAL The invention has been described in detail with particular reference to preferred embodiments, but it will be understood that variations and modifications can be effected within the scope of the invention as set forth in the appended claims.

What is claimed is:

1. A DLL (delay locked loop) circuit for outputting a phase lock signal having a predetermined phase relationship with an input signal, said DLL circuit comprising:
 a functional block having a constant current source; and
 a bias generation means for generating a constant current source bias signal for controlling the constant current source of the functional block, said bias generation means comprising bias control means which changes the bias signal according to the frequency of the input signal,
wherein the bias control means comprises:
a control circuit for outputting a first counting control signal which controls the start of counting of the input signal based on a predetermined external signal;
a counting control means for outputting a second counting control signal after the elapse of a predetermined time from the input of the first counting control signal;
counting means for controlling the start and end of counting of the input signal respectively according to the first counting control signal and the second counting control signal; and
correction signal generation means for outputting a bias correction signal based on the results of counting by the counting means.

2. The DLL circuit according to claim 1, wherein the output signal of the counting control means is controlled by the primary bias signal.

3. The DLL circuit according to claim 1, wherein:
the counting control means comprises PMOS (p-channel MOS), first NMOS (n-channel MOS), second NMOS (n-channel MOS), a capacitive element and a comparison circuit;
a source electrode terminal of PMOS is connected to a power terminal, a drain electrode terminal of PMOS is connected by common connection to a drain electrode terminal of the first NMOS, a first electrode terminal of the capacitive element, and a first input terminal of the comparison circuit;
source electrode terminal of the first NMOS is connected by common connection to d drain electrode terminal of the second NMOS:
a source electrode terminal of the second NMOS, together with a second electrode terminal of the capacitive element, is connected to a ground terminal;
a gate electrode terminal of each of PMOS and the first NMOS is connected by common connection to an output terminal of the control circuit for outputting the first counting control signal; a gate terminal of the second NMOS is connected to a primary bias output terminal of the first bias generation circuit; and
a second input terminal of the comparison circuit is connected to a reference signal terminal having a predetermined potential, and a second counting control signal is output from an output terminal of the comparison circuit.

4. A DLL (delay locked loop) circuit for outputting a phase lock signal having a predetermined phase relation ship with an input signal, said DLL circuit, comprising:
a functional block having a current source;
bias generation means for generating a current source bias signal for controlling the current source of the functional block, wherein said bias generation means comprising bias control means which changes the bias signal according to the frequency of the input signal;
a differential amplifier receiving current from the current source;
phase shifting means for generating m phase shift processing signals, wherein m is an integer of two or more, different from each other in phase based on the input signal;
phase comparison means which compares the phase of the input signal with the phase of the phase lock signal to detect a phase difference and, based on the detected phase difference, outputs a phase control signal;
phase synthesizing means for outputting a phase corrected signal having a predetermined phase relationship with the input signal based on the m phase shift processing signals, produced by the phase shifting means, and the phase control signal; and
first duty correction means which corrects the duty of the phase corrected signal and outputs the phase lock signal.

5. The DLL circuit according to claim 4 further comprising second duty correction means for correcting the duty of the input signal and outputting a duty corrected signal, wherein the duty corrected signal is input into the phase shifting means.

* * * * *